(12) United States Patent
Aoyama et al.

(10) Patent No.: US 9,857,411 B2
(45) Date of Patent: Jan. 2, 2018

(54) ELECTRONIC DEVICE HAVING FUNCTION OF DETECTING DEGRADATION OF PRINTED CIRCUIT BOARD

(71) Applicant: FANUC Corporation, Minamitsuru-gun, Yamanashi (JP)

(72) Inventors: Kazunari Aoyama, Minamitsuru-gun (JP); Kunitaka Komaki, Minamitsuru-gun (JP); Yasumichi Sakoda, Minamitsuru-gun (JP)

(73) Assignee: FANUC Corporation, Minamitsuru-gun, Yamanashi (JP)

( * ) Notice: Subject to any disclaimer, the term of this patent is extended or adjusted under 35 U.S.C. 154(b) by 155 days.

(21) Appl. No.: 14/612,473

(22) Filed: Feb. 3, 2015

(65) Prior Publication Data
US 2015/0219713 A1    Aug. 6, 2015

(30) Foreign Application Priority Data
Feb. 4, 2014    (JP) .................................. 2014-019509

(51) Int. Cl.
*G01R 31/28*    (2006.01)
*G01R 31/02*    (2006.01)

(52) U.S. Cl.
CPC ..... *G01R 31/2801* (2013.01); *G01R 31/2818* (2013.01); *G01R 31/025* (2013.01); *G01R 31/2812* (2013.01)

(58) Field of Classification Search
CPC .............. G01R 31/025; G01R 31/2812; G01R 31/2818; G01R 31/2801
See application file for complete search history.

(56) References Cited

U.S. PATENT DOCUMENTS 7,557,724 B2 *    7/2009    Breitling .............. G01R 19/165
                                                               340/635

FOREIGN PATENT DOCUMENTS

| CN | 102890233 A | 1/2013 |
|----|-------------|--------|
| JP | H07-249840 A | 9/1995 |
| JP | H08-220158 A | 8/1996 |
| JP | H10-62476 A | 3/1998 |
| JP | H10-163584 A | 6/1998 |
| JP | H10-239374 A | 9/1998 |
| JP | 2001-251026 A | 9/2001 |
| JP | 2001-330631 A | 11/2001 |
| JP | 2001-343414 A | 12/2001 |
| JP | 2001-358429 A | 12/2001 |
| JP | 2003-217483 A | 7/2003 |
| JP | 2006-019405 A | 1/2006 |
| JP | 2009-117483 A | 5/2009 |
| JP | 2009-264989 A | 11/2009 |

(Continued)

OTHER PUBLICATIONS

JP 2009-264989 translation.*

(Continued)

*Primary Examiner* — Minh N Tang
(74) *Attorney, Agent, or Firm* — Drinker Biddle & Reath LLP

(57) ABSTRACT

An electronic device including a printed circuit board has a degradation detection circuit that detects degradation of the printed circuit board at a plurality of different degradation levels, and a warning output unit that outputs a warning in accordance with the degradation level detected by the degradation detection circuit.

18 Claims, 7 Drawing Sheets

(56) References Cited

FOREIGN PATENT DOCUMENTS

JP      2011-181785 A     9/2011
JP      2011-227151 A     11/2011

OTHER PUBLICATIONS

JP 2001-343414 translation.*
Notification of Reasons for Refusal dated Apr. 28, 2015, along with its English-language translation, in corresponding Japanese Patent Application 2014-019509.
The Notification of the First Office Action dated Jun. 1, 2017 in Chinese Patent Application No. 2015100557289 (8 pages) with an English translation (11 pages).

* cited by examiner

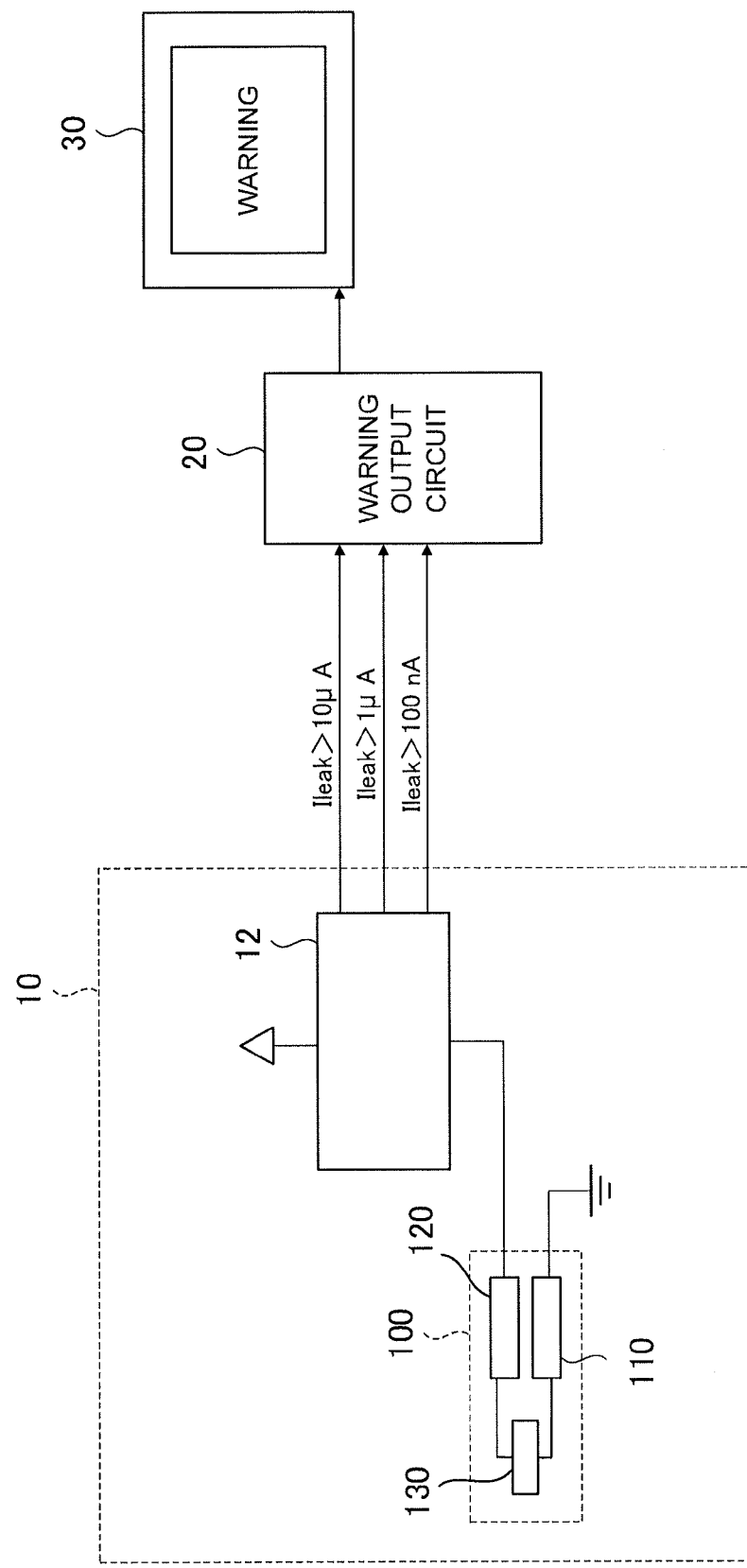

STATUS OF PROGRESS OF DEGRADATION IS FOUND WHILE MONITOR ELECTRODES ARE BEING CUT TO CHANGE RESISTANCE VALUE

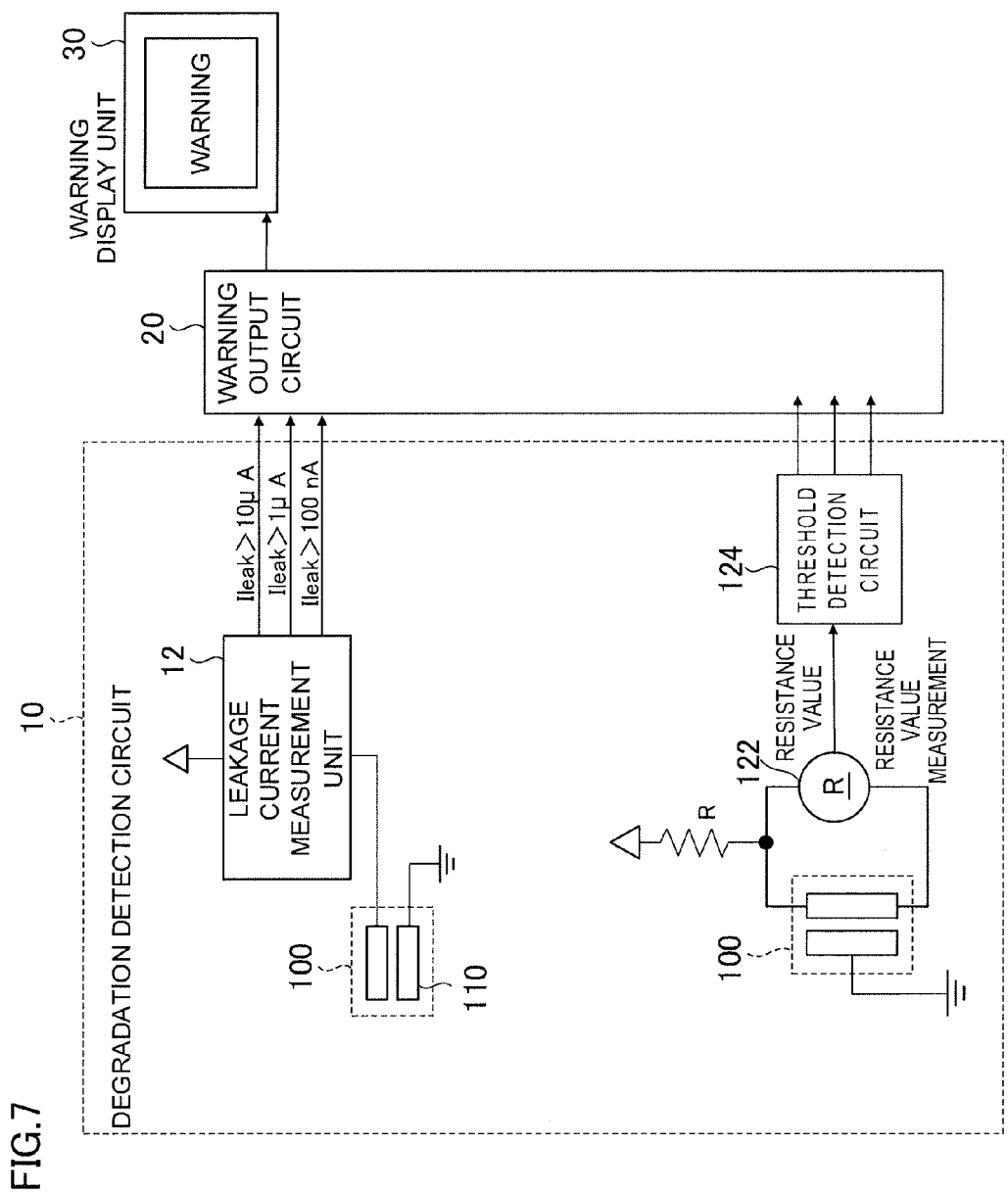

ELECTRONIC DEVICE HAVING FUNCTION OF DETECTING DEGRADATION OF PRINTED CIRCUIT BOARD

RELATED APPLICATION DATA

This application claims priority under 35 U.S.C. §119 and/or §365 to Japanese Application No. 2014-019509 filed Feb. 4, 2014, the entire contents is incorporated herein by reference.

BACKGROUND OF THE INVENTION

Field of the Invention

The present invention relates to an electronic device, and specifically relates to an electronic device having a function of detecting degradation of a printed circuit board used for an electronic device such as a numerical control device.

Description of the Related Art

In an electric circuit and an electronic circuit used for various kinds of electronic devices, a printed circuit board is often used such that a circuit pattern composed of a conductive material is provided on a board composed of an insulative material. In the environment where a device including such a printed circuit board is used, there is a case where the printed circuit board is contaminated with powder dusts, cutting fluid and the like to suffer malfunction. In particular, when a state where the cutting fluid sticks to the printed circuit board is lasting for a long period, wires on the printed circuit board are sometimes corroded, and as a further progress of the corrosion, the wires are being broken, which causes the malfunction.

Examples of methods of detecting such degradation of the printed circuit board include the following technologies.

Japanese Patent Laid-Open No. 2009-264989 discloses a control device including a printed circuit board, including wires for detecting degradation with an interval same as or more of the minimum wire interval in the printed circuit board, a voltage application circuit that applies a defined voltage between the wires, a degradation determination circuit that is connected to the wires and detects the presence or absence of decrease in insulation resistance, an integration circuit that integrates signals obtained by detecting the presence or absence of decrease in insulation resistance, and an abnormality signal generation circuit that generates an abnormality signal corresponding to times of the integration at the integration circuit.

Japanese Patent Laid-Open No. 2006-19405 discloses a device in which, in order to enable detection of degradation and malfunction of a printed wiring board, a predetermined voltage is applied to one of input terminals of the pins of an IC and the other of input terminals is grounded. According to such connection, insulation degradation between the pins of the IC is detected.

Japanese Patent Laid-Open No. 2001-251026 discloses a device in which, for patterns at the same voltage in a part of a printed circuit board, a pattern with a width narrower than that of the other wires and a pattern narrow in insulation distance are provided. Thus, line breakage caused by corrosion of the pattern and/or short circuit caused by migration or the like are configured to occur securely earlier than the other patterns. Such patterns are implemented therein as sensors to perform automatic notification to a maintenance center or the like.

In a device for detecting insulation degradation of a printed circuit board of Japanese Patent Laid-Open No. 10-239374, electrodes are disposed on the whole surface of the printed circuit board to find insulation degradation of the printed circuit board. In the case of the insulation degradation, to set a signal generated from a microcomputer to the H-level is suspended, so that power consumption of the printed circuit board is suppressed.

In Japanese Patent Laid-Open No. 10-62476, a pattern for detecting degradation is provided to be exposed to the air on a printed circuit board of a degradation detecting device. A constant current is allowed to flow from a power supply VCC via a resistor R0 and the like, and an A/D converter detects a voltage of both ends of the pattern. A determination circuit periodically analyzes the detection voltage. When the pattern is corroded to be thin, the detection voltage of the A/D converter increases. When the detection voltage exceeds a predetermined threshold, which is transmitted to a display circuit by the determination circuit, the display circuit performs display of a warning, buzzer output thereof or the like. Upon the warning, the operator performs maintenance or replacement of the printed circuit board unit.

Japanese Patent Laid-Open No. 8-220158 discloses a device for detecting degradation of insulation along the face, the device including a pair of electrodes which are disposed to oppose the surface of an insulation plate provided on the outer face of an electric device and are connected to a AC power supply, and an insulation property detection unit that detects a current flowing between the electrodes, compares it with a preset value and outputs an alarm signal to a display unit.

Japanese Patent Laid-Open No. 7-249840 discloses a device including a printed circuit board in which plural conductors constituting a part of an electronic circuit are provided on the surface of a base board by print wiring. A pair of electrode conductors are provided in advance by print wiring to closely oppose each other without contact with each other at positions independent from the conductors constituting the electronic circuit on the surface of the base board such that there are certain resistance value and electrostatic capacity between both of them. The device predicts time to short circuit between the conductors.

Japanese Patent Laid-Open No. 2001-358429 discloses a technology in which electrode conductors for detecting degradation are formed by printing at positions independent from conductors constituting an electronic circuit, and the degradation of the conductors constituting the electronic circuit is detected on the basis of chronological change in electric characteristics measured with the electrode conductors for detecting degradation.

In the technologies disclosed in Japanese Patent Laid-Open No. 2009-264989, Japanese Patent Laid-Open No. 2006-19405, Japanese Patent Laid-Open No. 2001-251026, Japanese Patent Laid-Open No. 10-239374, Japanese Patent Laid-Open No. 10-62476, Japanese Patent Laid-Open No. 8-220158, Japanese Patent Laid-Open No. 7-249840 and Japanese Patent Laid-Open No. 2001-358429, the degradation is detected and reported on the basis of the presence or absence of decrease of the insulation resistance, the detection of the insulation degradation, the decrease of the resistance value, the detection of the current, the change in electric characteristics, and the like. However, in any of the above cases, the reference value is singular and a warning is not outputted in accordance with a plurality of degradation levels. Hence, only the notification of the presence or absence of the degradation is performed, and there is a concern that sufficient notification of the degree of degradation or the like cannot be performed.

SUMMARY OF THE INVENTION

Therefore, an object of the present invention is to provide an electronic device capable of prevention and protection from failure of the electronic device by reporting degradation of wires which is caused by foreign objects which stick to a printed circuit board of the electronic device, in accordance with a plurality of degradation levels.

An electronic device according to the present invention includes a printed circuit board and has a function of detecting degradation of the printed circuit board, the electronic device including: a degradation detection circuit configured to detect the degradation of the printed circuit board at a plurality of different degradation levels; and a warning output unit configured to output a warning in accordance with the degradation level detected by the degradation detection circuit.

The degradation of the printed circuit board is detected at the plurality of different degradation levels. Thereby, the degradation of wires on the printed circuit board can be detected in an early stage, and/or the status of progress of the degradation can be detected to perform the warning.

The printed circuit board may include at least one monitor electrode and at least one reference electrode adjacent to the monitor electrode, the degradation detection circuit may have a voltage application unit configured to apply a predetermined voltage between the monitor electrode and the reference electrode, and the voltage application unit may be configured to apply the predetermined voltage between the monitor electrode and the reference electrode.

The voltage application unit that applies the predetermined voltage is provided between the monitor electrode and the reference electrode. Thereby, migration of the monitor electrode is promoted and the degradation of wires on the printed circuit board is liable to occur. The detection of the degradation can be securely performed.

Furthermore, the voltage application unit may be the power supply different from the power supply for operating the printed circuit board.

The power supply different from the power supply for operating the printed circuit board is used as the voltage application unit that applies the predetermined voltage between the monitor electrode and the reference electrode. Thereby, the voltage can be applied between the monitor electrode and the reference electrode at all times. The degradation of wires on the printed circuit board is furthermore liable to occur. The detection of the degradation can be securely performed.

Moreover, the printed circuit board may include at least one monitor electrode and at least one reference electrode adjacent to the monitor electrode, and the degradation detection circuit may have a leakage current measurement unit configured to measure a leakage current between the monitor electrode and the reference electrode adjacent to the monitor electrode, and the degradation detection circuit may be configured to output the leakage current measured by the leakage current measurement unit and a degradation signal according to a plurality of preset thresholds.

Otherwise, the printed circuit board may include at least one monitor electrode, and the degradation detection circuit may have a resistance value measurement unit configured to measure a resistance value of the monitor electrode, and the degradation detection circuit may be configured to output the resistance value measured by the resistance value measurement unit and a degradation signal according to a plurality of preset thresholds.

Otherwise, the printed circuit board may include at least one monitor electrode, and the degradation detection circuit may have a characteristic impedance measurement unit configured to measure a characteristic impedance of the monitor electrode, and the degradation detection circuit may be configured to output the characteristic impedance measured by the characteristic impedance measurement unit and a degradation signal according to a plurality of preset thresholds.

Otherwise, the printed circuit board may include a degradation detection unit, the degradation detection unit may include a plurality of monitor units which are connected in parallel, each of the plurality of monitor units including a resistor and a monitor electrode which are connected in series, and the degradation detection circuit may have a resistance value measurement unit configured to measure a combined resistance of the degradation detection unit, and, the degradation detection circuit may be configured to output at least one of the resistance value measured by the resistance value measurement unit and a degradation signal according to a plurality of preset thresholds.

According to the above configurations, the leakage current, the resistance value, the characteristic impedance or the like of the monitor electrode is measured, and the degradation signal is outputted in accordance with the plurality of configured thresholds. Thereby, the degradation of wires on the printed circuit board can be detected in an early stage, and/or the status of progress of the degradation can be detected to output the warning.

An electronic device according to the present invention includes a printed circuit board and has a function of detecting a degradation of the printed circuit board, the electronic device including: at least two or more degradation detection circuits of a first degradation detection circuit, a second degradation detection circuit, a third degradation detection circuit and a fourth degradation detection circuit that detect the degradation of the printed circuit board at a plurality of different degradation levels; and a warning output unit configured to output a warning in accordance with the degradation level detected by the at least two or more degradation detection circuits, and, the first degradation detection circuit includes at least one monitor electrode and at least one reference electrode adjacent to the monitor electrode on the printed circuit board, has a leakage current measurement unit configured to measure a leakage current between the monitor electrode and the reference electrode adjacent to the monitor electrode, and the first degradation detection circuit being configured to output the leakage current measured by the leakage current measurement unit and a degradation signal according to a plurality of preset thresholds, the second degradation detection circuit includes at least one monitor electrode on the printed circuit board, has a resistance value measurement unit configured to measure a resistance value of the monitor electrode, and the second degradation detection circuit being configured to output the resistance value measured by the resistance value measurement unit and the degradation signal according to the plurality of preset thresholds, the third degradation detection circuit includes at least one monitor electrode on the printed circuit board, has a characteristic impedance measurement unit configured to measure a characteristic impedance of the monitor electrode, and the third degradation detection circuit being configured to output the characteristic impedance measured by the characteristic impedance measurement unit and the degradation signal according to the plurality of preset thresholds, and the fourth degradation detection circuit includes a plurality of monitor units which are connected in parallel, each of the plurality of monitor units including a resistor and a monitor electrode which are connected in series, has a combined resistance value measurement unit configured to measure a combined resistance of the fourth degradation detection circuit, and the fourth degradation detection circuit being configured to output at least one of the resistance value measured by the combined resistance value measurement unit and the degradation signal according to the plurality of preset thresholds.

The plurality of measurement units of the above-mentioned leakage current measurement unit and resistance value measurement unit and the like is used for the degradation detection. Thereby, the detection accuracy of the degradation can be enhanced.

A resist on the monitor electrode may be eliminated.

The configuration of eliminating the resist on the monitor electrode allows the wire to be readily corroded, which enables the detection of the degradation of the wire to be readily performed.

Otherwise, the printed circuit board may include at least one monitor electrode and at least one reference electrode adjacent to the monitor electrode, and roughness for trapping a foreign object may be provided on a surface of the printed circuit board between the monitor electrode and the reference electrode.

The roughness for trapping the foreign object is provided on the surface of the printed circuit board. Thereby, the foreign object is liable to be trapped on the printed circuit board. Thus, the detection of the foreign object can be readily performed and/or the corrosion of wires is liable to occur, which enables the detection of the degradation of wires to be readily performed.

The electronic device may have a mist collection unit configured to collect a mist in the periphery of the electronic device to a specific place, and the monitor electrode may be disposed at the place where the mist is collected by the mist collection unit.

The monitor electrode is disposed at the place where the mists in the air are collected. Thereby, sticking of the mists can be detected in the initial state.

The present invention includes the above-mentioned configurations. Thereby, the prevention and protection from the failure of the electronic device are enabled by reporting the degradation of wires which is caused by foreign objects which stick to the printed circuit board of the electronic device, in accordance with the plurality of degradation levels.

BRIEF DESCRIPTION OF THE DRAWINGS

Other objects and features, as well as the above-mentioned ones, of the present invention will be apparent more from the following detailed description of the embodiments with reference to the accompanying drawings, wherein:

FIG. 1 is a block diagram illustrating an overview of an electronic device according to a first embodiment having a function of detecting degradation of a printed circuit board;

FIG. 7 is a block diagram illustrating an overview of an electronic device according to a fifth embodiment having a function of detecting degradation of a printed circuit board;

DETAILED DESCRIPTION OF THE PREFERRED EMBODIMENTS

First Embodiment

Figure 2A:
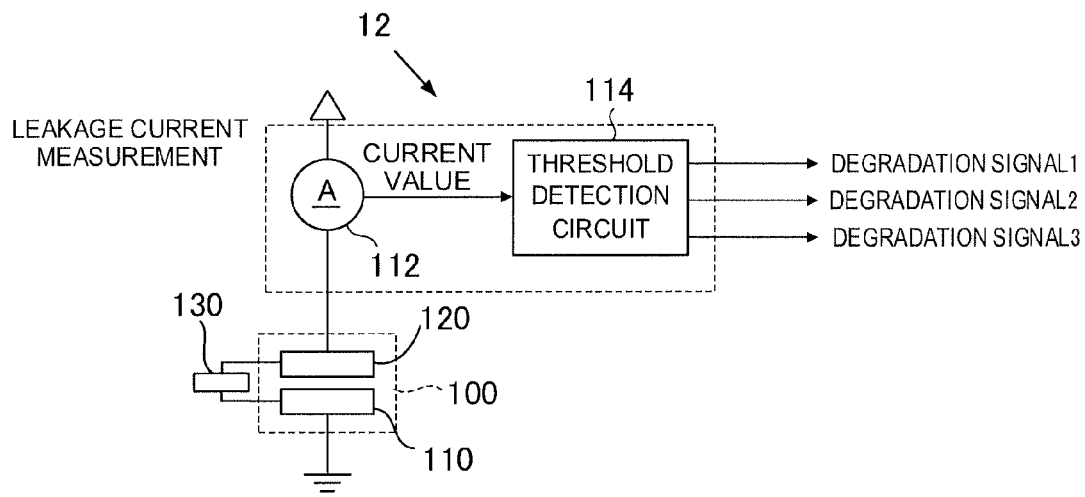
FIGS. 2A and 2B are diagrams illustrating an internal configuration of a leakage current measurement unit and change in leakage current.

FIG. 1 is a block diagram illustrating an overview of an electronic device according to the embodiment having a function of detecting degradation of a printed circuit board. The electronic device according to the embodiment is constituted of a degradation detection circuit 10, a warning output circuit 20 and a warning display unit 30, and inside the degradation detection circuit 10, a leakage current measurement unit 12 and a degradation detection unit 100 are provided. The degradation detection unit 100 is configured of a wire 120 disposed on a printed circuit board, a reference electrode 110 whose wire traveling parallel to the wire 120 is grounded, and a voltage application unit 130 that applies a voltage between the wire 120 and the reference electrode 110.

Figure 2B:
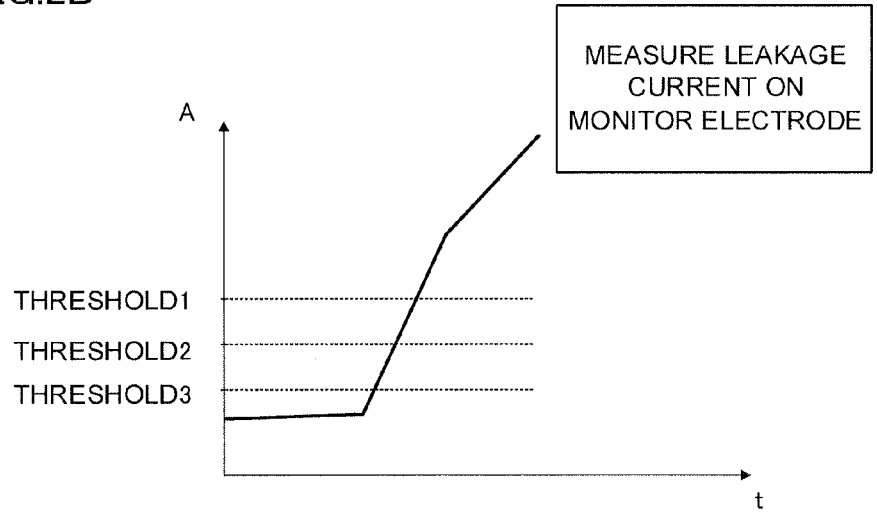

FIG. 2A is a diagram illustrating an internal configuration of the leakage current measurement unit 12. The leakage current measurement unit 12 includes an ammeter 112 and a threshold detection circuit 114 inside. The ammeter 112 is connected to the wire 120 disposed on the printed circuit board and measures a leakage current of the wire 120. The threshold detection circuit 114 is connected to the ammeter 112 and outputs a plurality of kinds of degradation signals (three kinds in the embodiment) on the basis of comparison with a plurality of predefined thresholds as illustrated in FIG. 2B as a graph. In the embodiment, three thresholds are configured to be 100 nA, 1 µA and 10 µA as illustrated in FIG. 1, and in the case of excess over each of the thresholds, a corresponding different degradation signal is outputted.

The voltage application unit 130 has a function of promoting migration of the wire 120 disposed on the printed circuit board to cause degradation of the wire 120 to be liable to arise by applying a voltage between the reference electrode 110 and the wire 120. The voltage value applied by the voltage application unit 130 can adopt the voltage value used on the printed circuit board in which the degradation detection circuit 10 is implemented, such, for example, as 24 V, 15 V, 12 V, 5 V, 3.3 V, 2.5 V, 1.8 V and 1.5 V, and in view of promoting the migration, a high voltage is preferable to be applied. Moreover, while the voltage application unit 130 is schematically illustrated in FIG. 1, as the voltage application unit 130, the one same as a power supply for operating the electronic device can be used, or a power supply dedicated to the application between the reference electrode 110 and the wire 120 separately from the power supply for operating the electronic device can also be used. As a technique of providing a power supply separately from the power supply for operating the electronic device, a battery or a super capacitor implemented on the printed circuit board can be used, or a configuration in which a power supply installed outside performs the application can be adopted.

Figure 3:
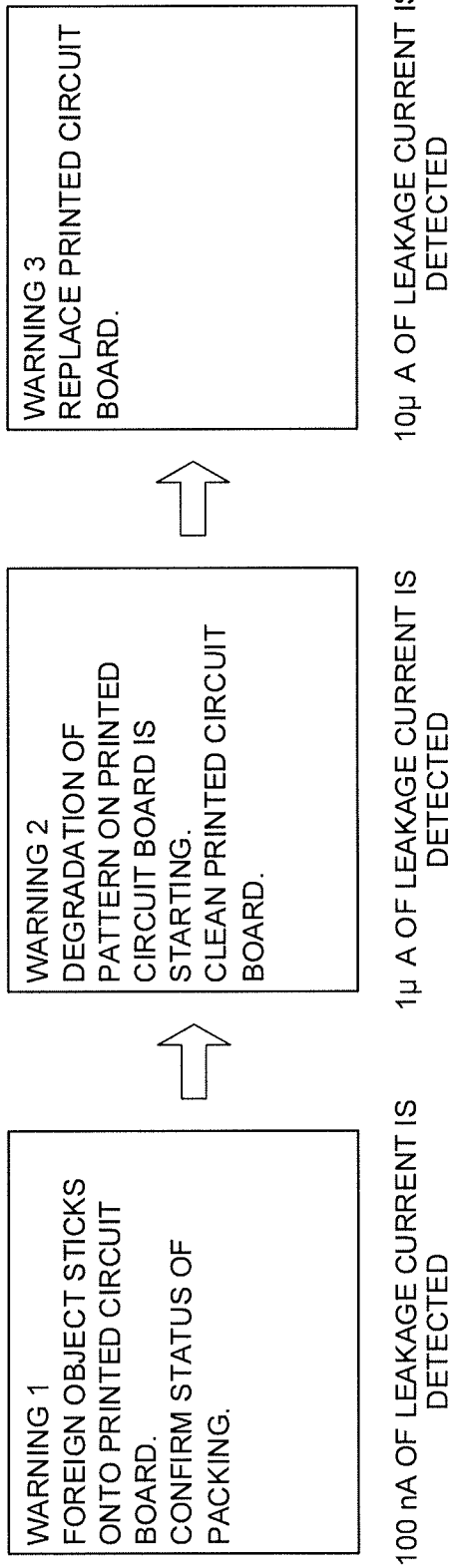
FIG. 3 is a diagram illustrating an example of a warning displayed on a warning display unit.

The warning output circuit 20 outputs a warning to the warning display unit 30 in accordance with a degradation signal outputted from the leakage current measurement unit 12 of the degradation detection circuit 10. The warning display unit 30 displays the warning outputted from the warning output circuit 20. FIG. 3 illustrates examples of the warning displayed on the warning display unit 30. When the value of the leakage current exceeds 100 nA, the warning "A foreign object sticks onto the printed circuit board. Confirm the status of the packing." is displayed as a warning 1 which is the least serious warning.

Next, when the value of the leakage current is further increased to be 1 μA, the warning "Degradation of the pattern on the printed circuit board is starting. Clean the printed circuit board." is displayed as a warning 2 which is a medium-level warning.

When the value of the leakage current is further increased to be 10 μA, the warning "Replace the printed circuit board." is displayed as a warning 3 which is the most serious warning.

Thereby, different warnings are displayed in accordance with the degradation level, the operator can properly grasp the status of degradation of the printed circuit board. Moreover, in the embodiment, while the warning display unit 30 is configured to display a message on a display device, lighting of a lamp can also perform the notification in place of the display of the message on the display device.

Notably, in the embodiment, while the wire disposed on a part of the printed circuit board is used as the monitor electrode, the wire can also be disposed to be longer to enclose the outer circumference of the printed circuit board.

Moreover, in the degradation detection unit 100 according to the embodiment, while the voltage is applied between the wire 120 and the reference electrode 110 by the voltage application unit 130 in order to promote the degradation of the wire 120, the leakage current of the wire 120 can also be configured to be measured without providing the voltage application unit 130.

Second Embodiment

Figure 4A:
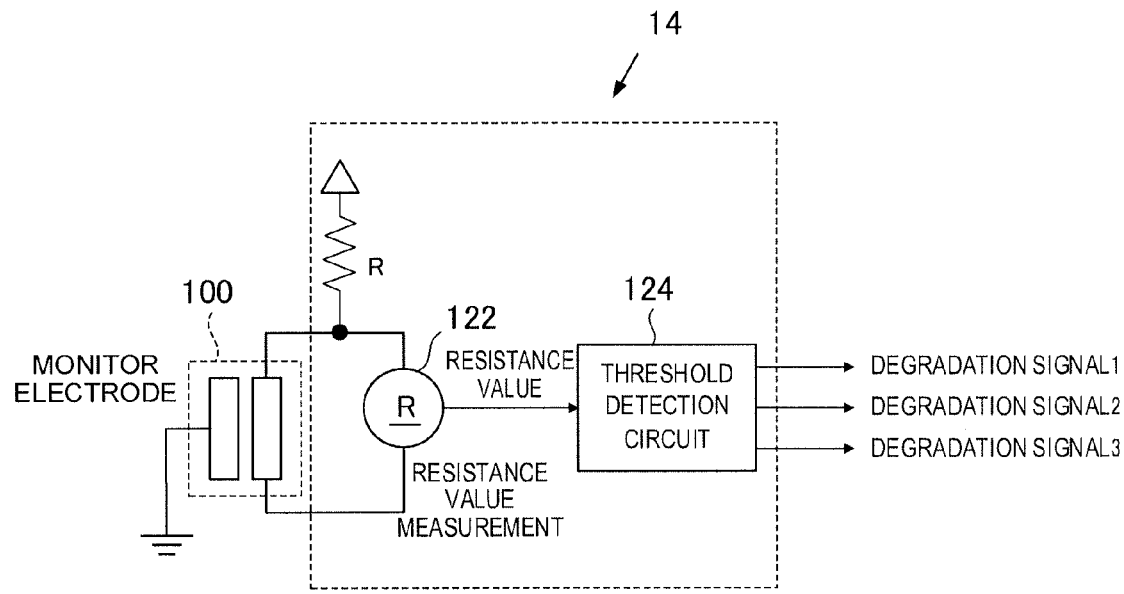
FIGS. 4A and 4B are diagrams illustrating an internal configuration of a resistance value measurement unit according to a second embodiment and change in resistance value.
Figure 4B:
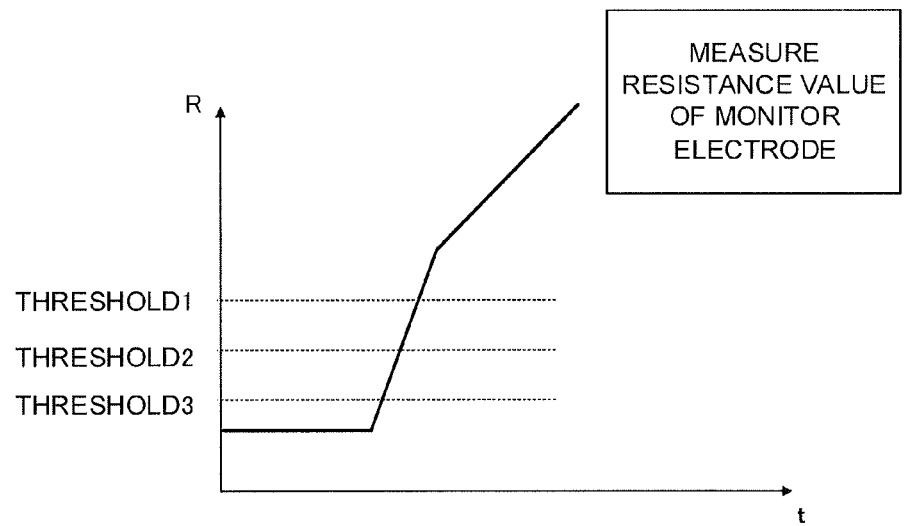

The embodiment is different from the first embodiment in that a resistance value measurement unit 14 is used in place of the leakage current measurement unit 12 in the first embodiment. Its basic configuration for the others is similar to the configuration in the first embodiment (the same holds true for the following embodiments). FIG. 4A is a diagram illustrating an internal configuration of the resistance value measurement unit 14. The resistance value measurement unit 14 includes a resistance value measurement device 122 and a threshold detection circuit 124. The resistance value measurement device 122 is connected to the wire 120 disposed on the printed circuit board and measures the resistance value of the wire 120. The threshold detection circuit 124 is connected to the resistance value measurement device 122 and outputs the plurality of kinds of degradation signals (three kinds in the embodiment) on the basis of comparison with a plurality of predefined thresholds as illustrated in FIG. 4B as a graph. The operation of the warning output circuit 20 in the occasion of excess over the thresholds and the modes of the messages in the warning display unit 30 are similar to those in the first embodiment.

Third Embodiment

Figure 5:
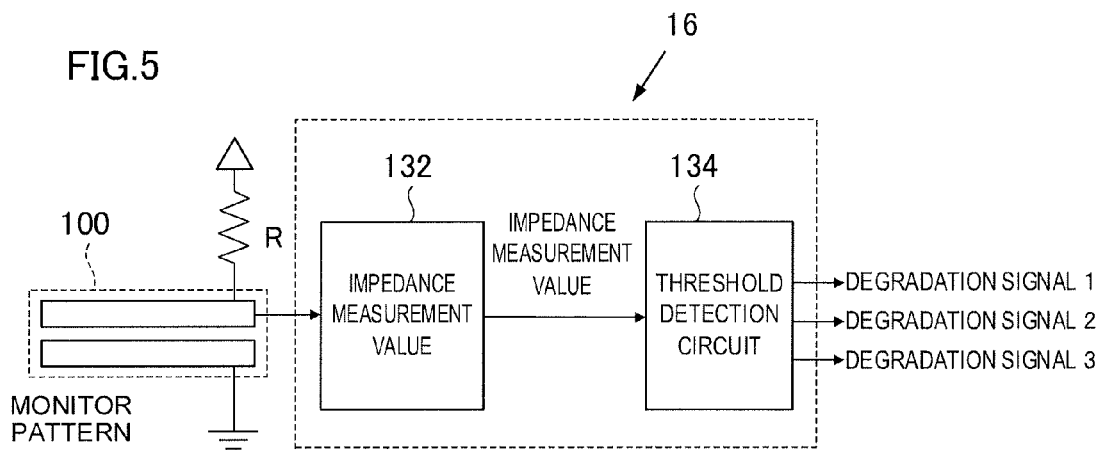
FIG. 5 is a diagram illustrating an internal configuration of an impedance measurement unit according to a third embodiment.

The embodiment is different from the second embodiment in that an impedance measurement unit 16 is used in place of the resistance value measurement unit 14 in the second embodiment. FIG. 5 is a diagram illustrating an internal configuration of the impedance measurement unit 16. The impedance measurement unit 16 includes an impedance measurement device 132 and a threshold detection circuit 134. The impedance measurement device 132 is connected to the wire 120 disposed on the printed circuit board and measures a characteristic impedance inherent to the wire 120. The threshold detection circuit 134 is connected to the impedance measurement device 132. It outputs the plurality of kinds of degradation signals on the basis of comparison with a plurality of predefined thresholds similarly to the second embodiment. The operation of the warning output circuit 20 in the occasion of excess over the thresholds and the modes of the messages in the warning display unit 30 are similar to those in the first embodiment and the second embodiment.

Fourth Embodiment

Figure 6A:
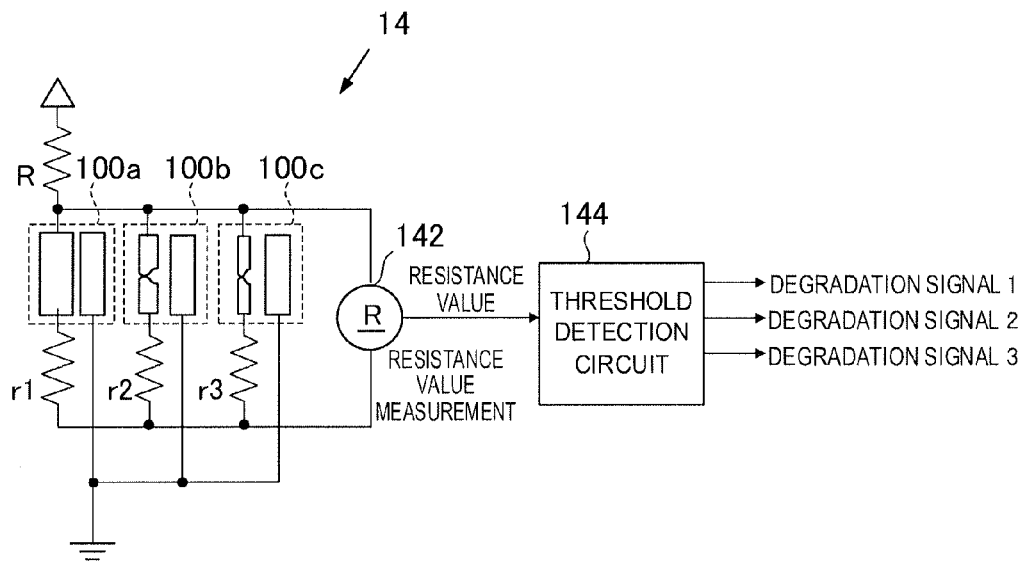
FIGS. 6A and 6B are diagrams illustrating an internal configuration of a resistance value measurement unit according to a fourth embodiment and change in resistance value.
Figure 6B:
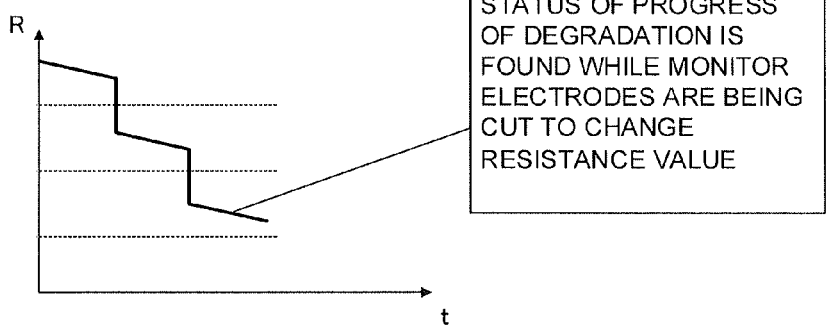

The embodiment is different from the second embodiment in that the resistance value measurement unit 14 in the second embodiment is configured such that a plurality of monitor units in each of which a resistor (r1, r2, r3) and a degradation detection unit (100a, 100b, 100c) are connected in series are connected in parallel as illustrated in FIG. 6A. The degradation detection units 100 are configured to have the wires 120 changed stepwise in width. A combined resistance of the degradation detection units 100 is measured and the degradation signal according to the measured combined resistance and the preset thresholds is outputted to the warning output circuit. The widths of the wires 120 are changed stepwise, and thereby, the wires 120 are degraded stepwise. According to this, the status of progress of the degradation can be readily grasped by the stepwise change in resistance value as illustrated in a graph of FIG. 6B.

Fifth Embodiment

The embodiment is characterized in that two of the leakage current measurement unit 12 and the resistance value measurement unit 14 are used for the degradation detection as illustrated in FIG. 7. The configurations of the leakage current measurement unit 12 and the resistance value measurement unit 14 are similar to the configurations of the leakage current measurement unit 12 and the resistance value measurement unit 14 used in the first embodiment and the second embodiment, respectively. The warning output circuit 20 is configured such that, in an initial stage of the degradation, the value of the leakage current outputted from the leakage current measurement unit 12 is used, and in a stage of progress of the degradation, the value of the resistance value outputted from the resistance value measurement unit 14 is used to output the warning.

In the initial stage of the degradation of the pattern wire, occurrence of the degradation can be found by measuring the leakage current. Nevertheless, there is a case where the status of progress of the pattern degradation is difficult to be directly found by measuring the leakage current since the degradation of the pattern wire sometimes progresses even at a constant leakage current. On the contrary, the measurement of the resistance value of the monitor electrode is an effective method for directly finding the status of progress of the pattern degradation. Nevertheless, there is a case where the decrease of the resistance value is difficult to be detected in the initial state, that is, in the state of light degradation.

Therefore, in the embodiment, the warning is outputted according to any of the signals of the output from the leakage current measurement circuit and the output from the resistance value measurement unit, in accordance with the degradation signals outputted by the leakage current measurement circuit and the circuit of measuring the resistance value of the monitor electrode. Thereby, the accuracy of the detection can be further enhanced. According to the configuration, the warning indicating the confirmation of the state of the circuit board can be outputted on the basis of the signal from the leakage current measurement circuit in the initial stage of the pattern degradation, and the warning prompting the cleaning of the circuit board can be outputted on the basis of the signal from the circuit of measuring the resistance value of the monitor electrode in the stage where the pattern degradation progresses to some high extent, which enables the user to handle the respective state correspondingly.

Notably, in the embodiment, while the usage of the leakage current measurement circuit and the resistance value measurement circuit is exemplarily described, the accuracy of the degradation detection can be improved by a configuration of a properly-selected combination of the impedance measurement circuit used in the third embodiment, the multi-stage resistance value measurement circuit used in the fourth embodiment, and the like.

Sixth Embodiment

Figure 8A:
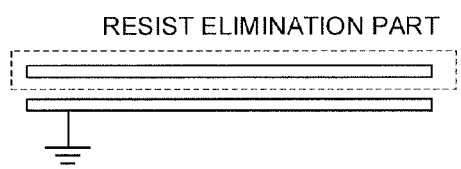
FIGS. 8A and 8B are diagrams illustrating a monitor electrode according to a sixth embodiment.
Figure 8B:
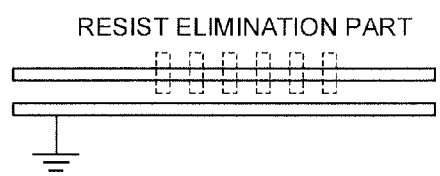

The embodiment is characterized in that a resist on the surface of the monitor electrode used in the above embodiments is eliminated. As to the elimination of the resist on the surface of the monitor electrode, as illustrated in FIG. 8A, the resist on the upper part of the monitor electrode may be entirely eliminated, or as illustrated in FIG. 8B, the resist may be partly eliminated into a shape of slits. As a method of eliminating the resist, the resist may be simply eliminated, or may be eliminated using a strippable resist.

The resist is eliminated according to the embodiment, and thereby, the monitor electrode is liable to be degraded, which enables the degradation to be readily detected. In particular, in the case of using the strippable resist, the monitor electrode is further more liable to be degraded since solder coating is not adhered to the monitor electrode.

Seventh Embodiment

Figure 9:
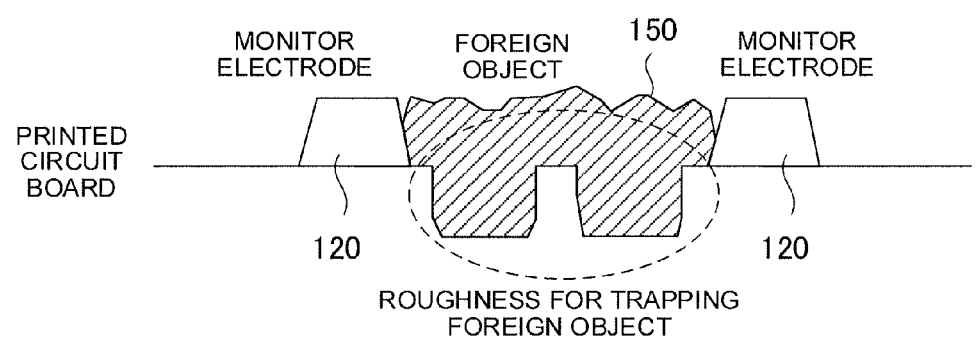
FIG. 9 is a diagram illustrating a monitor electrode according to a seventh embodiment.

In the embodiment, as illustrated in FIG. 9, roughness is provided between the monitor electrodes used in the above embodiments. Similarly to the above embodiments, the leakage current, the resistance value or the like of the monitor electrode is measured and the warning output circuit determines the degradation.

As to the monitor electrodes illustrated in FIG. 9, the resist between the monitor electrodes is eliminated to provide grooves. Thereby, a foreign object 150 is readily stuck in the grooves. The leakage current and the resistance value of the monitor electrodes are readily changed and/or the monitor electrodes are liable to be degraded. As the configuration of providing the roughness between the monitor electrodes, for example, a configuration in which silk printing is disposed on the upper part of the monitor electrodes along the monitor electrode may be adopted other than the configuration of providing the grooves illustrated in FIG. 9.

Eighth Embodiment

Figure 10:
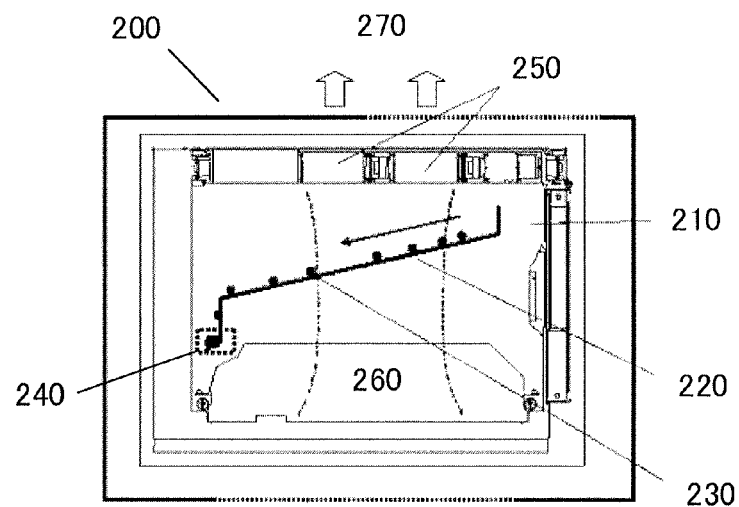
FIG. 10 is a diagram illustrating a place of disposing a monitor electrode according to an eighth embodiment.

In the embodiment, as illustrated in FIG. 10, an electronic device 200 has a member of collecting mists 230 to a specific place. In the place where this member collects the mists 230, a monitor electrode 240 used in the above embodiments is disposed. Notably, reference numeral 260 designates an air blowing path and reference numeral 270 designates wind.

As the configuration of collecting the mists 230 to the specific place, there is a configuration realized by an air blowing unit (cooling fan 250) included in the electronic device 200, and a housing 210 having a guide unit 220 of guiding the mists 230 in the air collected by the air blowing unit (cooling fan 250) to the specific place. The specific place is an arbitrary part, on the printed circuit board, to which the guiding by the guide unit 220 of the housing 210 is performed. It is preferably a place in which electronic components or wires are not disposed, in order not to affect the operation of the electronic device 200. Notably, the mists 230 are cutting fluid, dusts and the like floating in the periphery of the electronic device.

Similarly to the above embodiments, the leakage current, the resistance value or the like of the monitor electrode is measured and the warning output circuit determines the degradation.

What is claimed is:

1. An electronic device including a printed circuit board and having a function of detecting degradation of the printed circuit board, the electronic device comprising:
    a degradation detection circuit configured to detect the degradation of the printed circuit board at a plurality of different degradation levels and to output a degradation signal according to the plurality of different degradation levels; and
    a warning output unit configured to output a warning in accordance with the degradation level detected by the degradation detection circuit,
    wherein the printed circuit board includes a plurality of monitor units connected in parallel, each monitor unit of the plurality of monitor units includes a resistor and a monitor electrode connected in series;
    wherein the degradation detection circuit has a resistance value measurement unit configured to measure a combined resistance of the plurality of monitor units, and
    wherein the degradation detection circuit is configured to output at least one of the resistance value measured by the resistance value measurement unit and the degradation signal according to a plurality of preset thresholds.

2. The electronic device having a function of detecting degradation of the printed circuit board according to claim 1, wherein the printed circuit board further includes:
    at least one second monitor electrode;
    at least one reference electrode adjacent to the at least one second monitor electrode, and
    wherein the degradation detection circuit further includes:
    a voltage application unit configured to apply a predetermined voltage between the at least one second monitor electrode and the at least one reference electrode, the voltage application unit being configured to apply the predetermined voltage between the at least one second monitor electrode and the at least one reference electrode.

3. The electronic device having a function of detecting degradation of a printed circuit board according to claim 2, wherein the voltage application unit is a power supply different from a power supply for operating the printed circuit board.

4. The electronic device having a function of detecting degradation of the printed circuit board according to claim 1, wherein the printed circuit board further includes:
   at least one second monitor electrode;
   at least one reference electrode adjacent to the at least one second monitor electrode, and
   wherein the degradation detection circuit further includes:
   a leakage current measurement unit configured to measure a leakage current between the at least one second monitor electrode and the at least one reference electrode adjacent to the at least one second monitor electrode, and
   wherein the degradation detection circuit is configured to output the leakage current measured by the leakage current measurement unit and the degradation signal according to a plurality of preset thresholds.

5. The electronic device having a function of detecting degradation of the printed circuit board according to claim 4, wherein a resist on the at least one second monitor electrode is eliminated.

6. The electronic device having a function of detecting degradation of the printed circuit board according to claim 4, further comprising:
   a mist collection unit configured to collect a mist in the periphery of the electronic device to a specific place, and
   wherein the at least one second monitor electrode is disposed at the place where the mist is collected by the mist collection unit.

7. The electronic device having a function of detecting degradation of the printed circuit board according to claim 1, wherein the printed circuit board further includes:
   at least one second monitor electrode, and
   wherein the degradation detection circuit has a second resistance value measurement unit configured to measure a resistance value of the at least one second monitor electrode, and
   wherein the degradation detection circuit is configured to output the resistance value measured by the at least one second resistance value measurement unit and the degradation signal according to a plurality of preset thresholds.

8. The electronic device having a function of detecting degradation of the printed circuit board according to claim 7, wherein a resist on the at least one second monitor electrode is eliminated.

9. The electronic device having a function of detecting degradation of the printed circuit board according to claim 7, further comprising:
   a mist collection unit configured to collect a mist in the periphery of the electronic device to a specific place, and,
   the at least one second monitor electrode is disposed at the place where the mist is collected by the mist collection unit.

10. The electronic device having a function of detecting degradation of the printed circuit board according to claim 1, wherein the printed circuit board further includes:
    at least one second monitor electrode, and
    wherein the degradation detection circuit has a characteristic impedance measurement unit configured to measure a characteristic impedance of the at least one second monitor electrode, and
    wherein the degradation detection circuit is configured to output the characteristic impedance measured by the characteristic impedance measurement unit and the degradation signal according to a plurality of preset thresholds.

11. The electronic device having a function of detecting degradation of the printed circuit board according to claim 10, wherein a resist on the at least one second monitor electrode is eliminated.

12. The electronic device having a function of detecting degradation of the printed circuit board according to claim 10, further comprising:
    a mist collection unit configured to collect a mist in the periphery of the electronic device to a specific place, and,
    the at least one second monitor electrode is disposed at the place where the mist is collected by the mist collection unit.

13. The electronic device having a function of detecting degradation of the printed circuit board according to claim 1, wherein the printed circuit board further includes:
    at least one second monitor electrode and at least one reference electrode adjacent to the at least one second monitor electrode; and
    roughness for trapping a foreign object provided on a surface of the printed circuit board between the at least one second monitor electrode and the at least one reference electrode.

14. The electronic device having a function of detecting degradation of the printed circuit board according to claim 1, wherein a resist on the monitor electrode of a monitor unit of the plurality of monitor units is eliminated.

15. The electronic device having a function of detecting degradation of the printed circuit board according to claim 1, further comprising:
    a mist collection unit configured to collect a mist in the periphery of the electronic device to a specific place, and,
    the monitor electrode of a monitor unit of the plurality of monitor units is disposed at the place where the mist is collected by the mist collection unit.

16. An electronic device including a printed circuit board and having a function of detecting degradation of the printed circuit board, the electronic device comprising:
    a first degradation detection circuit;
    a second degradation detection circuit;
    a third degradation detection circuit; and
    a fourth degradation detection circuit, the first, second, third, and fourth degradation detection circuits configured to detect the degradation of the printed circuit board at a plurality of different degradation levels;
    a warning output unit configured to output a warning in accordance with the degradation level detected by the first, second, third, and fourth degradation detection circuits, and,
    the first degradation detection circuit comprising:
       at least one first monitor electrode and at least one first reference electrode adjacent to the first monitor electrode on the printed circuit board;
       a leakage current measurement unit configured to measure a leakage current between the first monitor electrode and the first reference electrode adjacent to the first monitor electrode, and,
       the first degradation detection circuit being configured to output the leakage current measured by the leakage current measurement unit and a first degradation signal according to a plurality of preset thresholds, and,
    the second degradation detection circuit comprising:

at least one second monitor electrode on the printed circuit board;

a resistance value measurement unit configured to measure a resistance value of the second monitor electrode, and, the second degradation detection circuit being configured to output the resistance value measured by the resistance value measurement unit and a second degradation signal according to the plurality of preset thresholds, and, the third degradation detection circuit comprising:

at least one third monitor electrode on the printed circuit board;

a characteristic impedance measurement unit configured to measure a characteristic impedance of the third monitor electrode, and the third degradation detection circuit being configured to output the characteristic impedance measured by the characteristic impedance measurement unit and a third degradation signal according to the plurality of preset thresholds, and the fourth degradation detection circuit comprising a plurality of fourth monitor units which are connected in parallel, each of the plurality of fourth monitor units including a resistor and a fourth monitor electrode which are connected in series, a combined resistance value measurement unit configured to measure a combined resistance of the fourth degradation detection circuit, and the fourth degradation detection circuit being configured to output at least one of the resistance value measured by the combined resistance value measurement unit and a fourth degradation signal according to the plurality of preset thresholds.

17. The electronic device having a function of detecting degradation of the printed circuit board according to claim 16, wherein a resist on each of the first, second, third, and fourth monitor electrodes is eliminated.

18. The electronic device having a function of detecting degradation of the printed circuit board according to claim 16, further comprising:

a mist collection unit configured to collect a mist in the periphery of the electronic device to a specific place, and, each of the first, second, third, and fourth monitor electrodes is disposed at the place where the mist is collected by the mist collection unit.

* * * * *